(12) United States Patent
Firmin et al.

(10) Patent No.: US 8,339,172 B2
(45) Date of Patent: Dec. 25, 2012

(54) FLIP-FLOP WITH SINGLE CLOCK PHASE AND WITH REDUCED DYNAMIC POWER

(75) Inventors: Fabian Firmin, Saint-Martin D'heres (FR); Sylvain Clerc, Grenoble (FR); Jean-Pierre Schoellkopf, Grenoble (FR); Fady Abouzeid, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 127 days.

(21) Appl. No.: 12/900,147

(22) Filed: Oct. 7, 2010

(65) Prior Publication Data

US 2011/0084748 A1 Apr. 14, 2011

(30) Foreign Application Priority Data

Oct. 9, 2009 (FR) ...................................... 09 57053

(51) Int. Cl.
*H03K 3/289* (2006.01)
(52) U.S. Cl. ...................... 327/202; 327/212; 327/218
(58) Field of Classification Search ................. 327/202, 327/203, 208, 210–212, 214, 215, 217–219
See application file for complete search history.

(56) References Cited

U.S. PATENT DOCUMENTS

| | | | | |
|---|---|---|---|---|
| 6,614,276 | B2 * | 9/2003 | Robertson et al. | 327/211 |
| 7,652,513 | B2 * | 1/2010 | Rao et al. | 327/203 |
| 2005/0151560 | A1 | 7/2005 | Hirata | 326/16 |
| 2005/0280459 | A1 | 12/2005 | Inoue | 327/203 |
| 2009/0058484 | A1 * | 3/2009 | Rao et al. | 327/202 |

FOREIGN PATENT DOCUMENTS

EP 1162742 12/2001

OTHER PUBLICATIONS

Sathe et al., "Resonant-Clock latch-based-design", IEEE journal of solid-state circuits, vol. 43, No. 4, Apr. 2008, pp. 864-873.

* cited by examiner

Primary Examiner — Long Nguyen
(74) Attorney, Agent, or Firm — Allen, Dyer, Doppelt, Milbrath & Gilchrist, P.A.

(57) ABSTRACT

A flip-flop may include a first master stage for latching data, a second slave stage for latching data, and an input multiplexer circuit receiving, as input, data to be latched in the flip-flop. The multiplexer may have single clock phase. The first master stage may be clocked based upon a clock phase, whereas the second stage may be clocked based upon another clock phase.

15 Claims, 4 Drawing Sheets

FLIP-FLOP WITH SINGLE CLOCK PHASE AND WITH REDUCED DYNAMIC POWER

FIELD OF INVENTION

The invention relates to flip-flops, in particular edge-triggered flip-flops with state retention. The invention applies advantageously, but not exclusively to flip-flops with state retention of master-slave type.

BACKGROUND OF THE INVENTION

An edge-triggered flip-flop is a component commonly used in microelectronics to store a binary value or a "state." FIG. 1 schematically illustrates the general architecture of such a flip-flop according to the prior art. As seen in this figure, a common way of making the flip-flop is to join together two latching memories 1a, and 1b, ("latches"), called respectively master flip-flop and a slave flip-flop, each clocked by two phases of a clock signal CPn corresponding to an inverted clock signal and CPi corresponding to a copy of the clock signal.

A latching memory may be a bistable structure including two inverters connected in such a way that the first inverter is looped back to its input through the second. Inverters controlled by two clock phases may be used to render the bistable structure either transparent to the data item coming from outside, or opaque for this data item. In this case, the bistable structure stores and copies the previous data item.

Such an inverter, illustrated in FIGS. 1a and 1b, may be designated as a double-phase controlled inverter. As seen in these figures, for example, in the configuration illustrated in FIG. 1a, these clock-controlled inverters respectively include, on the one hand two p-channel metal oxide semiconductor PMOS transistors Tr1 and Tr2 in series, one controlled by the data item D and the other by a phase of the clock Cpi and, on the other hand, two n-channel metal oxide semiconductor (NMOS) transistors Tr3 and Tr4, in series one controlled by the same data signal D and the other by a phase CPn inverse to the previous phase of the clock.

Two alternatives to such a device may also be used. These two alternatives are illustrated in FIGS. 2a and 2b. In FIG. 2a, the inverter comprises two PMOS transistors Tr5 and Tr6 in series, one controlled by a clock phase CPi, the other by the data signal D, and an NMOS transistor Tr7 controlled by the same data signal. This is a half-controlled PMOS inverter. In FIG. 2b, the inverter comprises two NMOS transistors Tr8 and Tr9 in series, one controlled by a phase of the clock CPi, and the other by the data signal D, and a PMOS transistor Tr9 controlled by the same data signal. This is a half-controlled NMOS inverter. These two alternatives illustrated in these FIGS. 2a and 2b) require only one clock phase.

Referring to FIG. 3 which illustrates the architecture of a flip-flop, the clock signals CPn and CPi are constructed by passing successively through a first inverter (CPn) and then through a second inverter (CPi). It may be common to regenerate the phase CPi copying the clock rather than to directly use the clock signal as input to decrease its load capacity. This passage through two inverters increases the circuit's energy consumption related to the activity of the clock, and may give rise to a delay between the clock signal and the data.

Moreover, the testability obligations for integrated circuits lead to the systematic use of a debugging multiplexer at the flip-flop input to transform, during the test, a set of flip-flops into a shift register ("scan shift register"), and to render accessible, in a static and macroscopic manner, the internal states of the circuit. This is the purpose of the multiplexer of the shift register whose selection signal is the signal TE.

It may be possible for the two functions of controlled inverter and of test multiplexer to be merged in a single complimentary oxide semiconductor (CMOS) stage. Currently, technologies for manufacturing electronic components may make it possible to obtain high-speed integrated circuits. Such is the case for the technique described in the publication "Resonant-Clock latch-based-design", IEEE journal of solid-state circuits, vol 43, No. 4, Apr. 2008, which describes a flip-flop architecture making it possible to obtain, in particular, faster latching memories ("latches"). Accordingly, as illustrated in FIGS. 4 and 5, which illustrate two embodiments of latch transparent respectively on a high phase and a low phase of a clock signal CP, a latching memory with single clock signal preceded by two half-controlled inverters in series are placed in series. Indeed, with a half-controlled inverter disabling only one data phase when the clock is deactivated, it may be necessary to connect two of them in series to render the set opaque for the two data phases. It may thus be possible to make a latching memory with a single clock signal transparent on a single clock edge by abutting two latches such as previously described: (L-latch Svensson) (H-latch Svensson).

SUMMARY OF THE INVENTION

In view of the foregoing, it is proposed to remedy the drawbacks related to the loss of energy and of transmission speed of the flip-flops while preserving a debugging multiplexer at input. There is further proposed an edge-triggered flip-flop with state retention comprising at input, a monitoring and correction multiplexer having smaller energy losses and a smaller clock signal/data signal delay than a conventional flip-flop.

The flip-flop comprises a first master stage for latching data, a second slave stage for latching data and a multiplexer receiving data to be latched in the flip-flop. Furthermore, the multiplexer has single clock phase, or mono clock phase. The first master stage may be clocked a first type of clock phase and the second slave stage clocked may be based upon a second type of clock phase.

Stated otherwise, the first master stage may operate on one phase, for example, the low phase of the clock signal, and the second slave stage may be transparent on the second clock phase, for example, the high phase. The single clock signal at the input of the multiplexer and for the entire flip-flop may make it possible to save energy and transmission time compared with the prior art with a flip-flop with two clock signals.

Advantageously, the first latching stage comprises a first inverter placed at the input of a first latching memory. The second latching stage comprises second and third inverters placed at the input of a second latching memory. Preferably, the various inverters present in the flip-flop may be inverters of the metal oxide semiconductor (MOS) type. Preferably, the two latching memories possess an asynchronous reset function independent of the clock signal. This may result in a change of state at the output of the flip-flop regardless of the phase of the clock, and after a time that is not dependent on the state of the clock. Accordingly, advantageously, the latching memory of the first latching stage comprises a half-controlled loopback inverter and a "NAND" logic gate placed in parallel. Moreover, the latching memory of the second latching stage comprises a half-controlled loopback inverter and a "NOR" logic gate placed in parallel. In one embodiment, the flip-flop comprises an NMOS transistor dependent on the clock signal placed between the multiplexer and the first master stage. The flip-flop also comprises a PMOS transistor between the two inverters of the second slave stage.

Indeed, the absence of activity of the single clock allows the voltage level at the intermediate point between the multiplexer and the following inverter to float, and this may lead to the presence of leakage current to a voltage level between logic "zero" and "one" creating a short circuit. To alleviate this drawback, it may be preferable to place transistors of relatively small size so as not to increase energy consumption, with the aim of fixing a potential at each point of the circuit.

BRIEF DESCRIPTION OF THE DRAWINGS

Other advantages and characteristics will be apparent on examining the detailed description of a flip-flop device according to an embodiment and the appended drawings in which.

DETAILED DESCRIPTION OF THE PREFERRED EMBODIMENTS

Figure 1A:
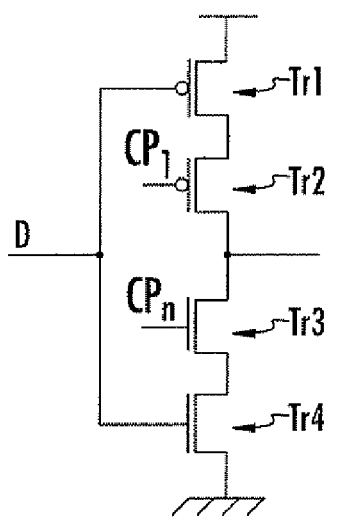
FIGS. 1a and 1b the are schematic diagrams of architectures of the controlled inverters and half-inverters according to the prior art.
Figure 1A:
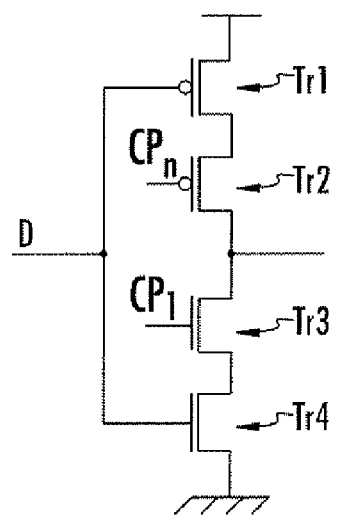
Figure 1A:
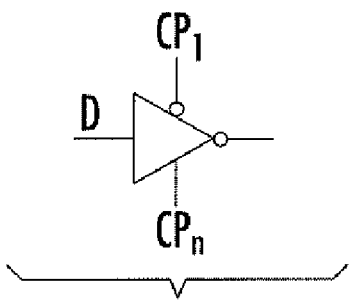
Figure 1B:
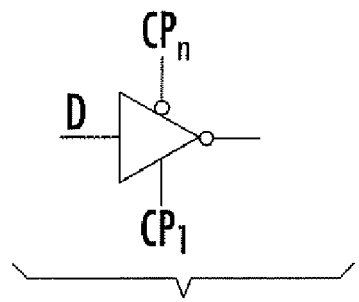
Figure 2A:
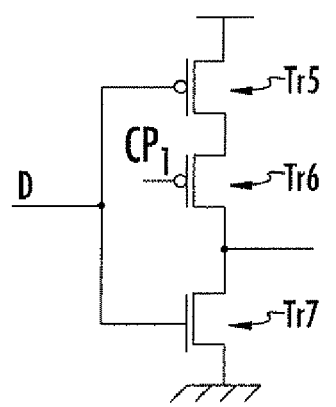
FIGS. 2a and 2b, are schematic diagrams of variants of the architectures of FIGS. 1a and 1b.
Figure 2A:
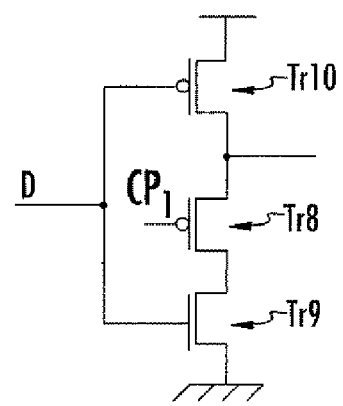
Figure 2A:
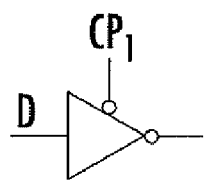
Figure 2B:
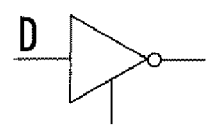
Figure 3:
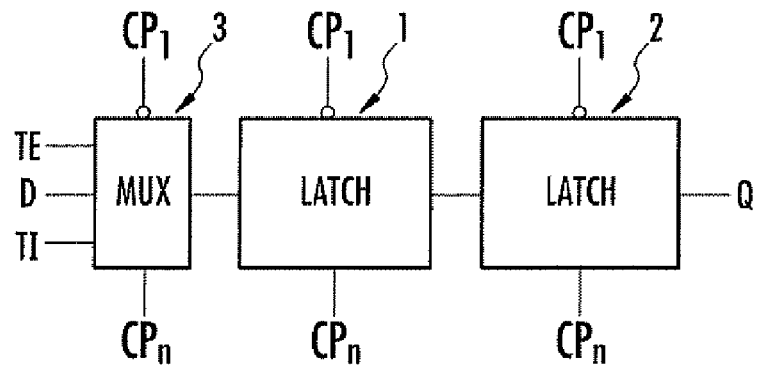
FIG. 3 is a schematic diagram of the general architecture of a flip-flop with state retention according to the prior art.
Figure 4:
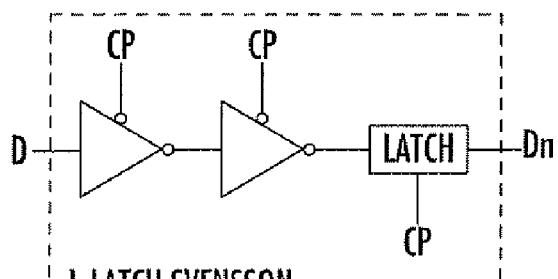
FIGS. 4 and 5 are schematic diagrams of the general architecture of a latching device clocked on a falling edge, and on a rising edge, respectively.
Figure 5:
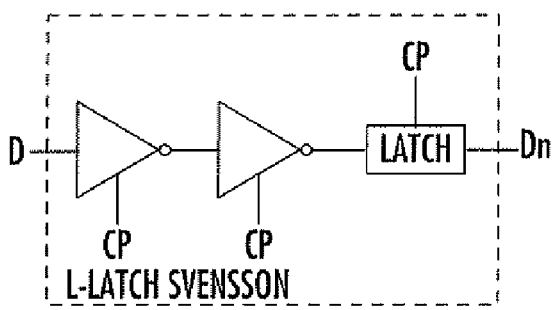
Figure 6:
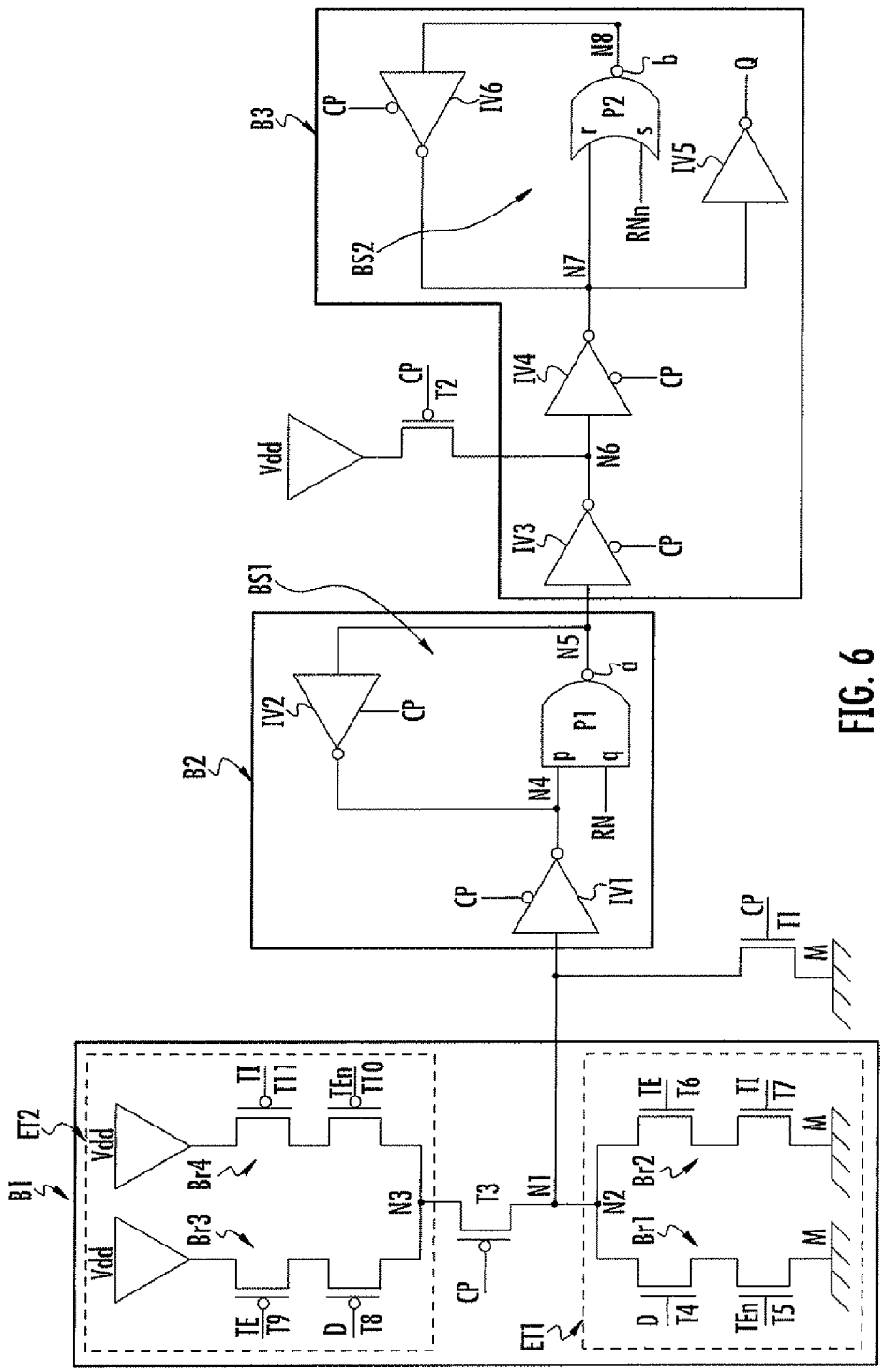
FIG. 6 is a schematic a diagram of an edge-triggered flip-flop with state retention according to an embodiment of the present invention.

Referring to FIG. 6 which, schematically illustrates a rising-edge-triggered flip-flop device according to an exemplary implementation, the device comprises a multiplexer block B1, a first latching block B2, a second latching memory block B3 coupled up at the output of the first memory block B2, a first NMOS transistor T1 between the multiplexer block 31 and the first memory block B2, and a second PMOS transistor T2 connected to the second memory block B3.

The multiplexer block B1 is a two-stage multiplexer based on the use of NMOS and PMOS transistors, merging the half-controlled inverter function and the CMOS multiplexer function. It comprises a first stage ET1 connected between the ground M and a common output node N1 and a second stage ET2 connected between a DC voltage source Vdd and the common node N3. The block B1 is controlled by a single clock signal CP by way of a third PMOS transistor T3.

As illustrated in FIG. 6, the first stage ET1 comprises two symmetric branches BR1 and BR2 extending in parallel between a node N1 and the ground M. Each branch BR1 and BR2 is formed by two NMOS transistors coupled in series, respectively T4 and T5, on the one hand and T6 and T7, on the other hand.

These transistors T4, T5, T6 and T7 are controlled on their gate respectively by the signals D, TEn, TE and TI. The fourth NMOS transistor T4, connected by its drain to the drain of the third PMOS transistor T3, is placed in series with the fifth NMOS transistor T5, whose source is linked to the ground M. The sixth NMOS transistor T6, connected by its drain to the drain of the third PMOS transistor T3, is placed in series with the seventh NMOS transistor T7 whose source is linked to the ground M.

Regarding the second stage ET2, the latter comprises two symmetric and parallel branches BR3 and BR4 extending between the DC voltage source Vdd and a node N3. Each branch BR3 and BR4 comprises a two PMOS transistors coupled in series, respectively T8 and T9, on the one hand and T10 and T11, on the other hand.

These transistors T8, T9, T10 and T11 are controlled on their gate respectively by the signals D, TE, TEn and TI. The eighth PMOS transistor T8, connected by its drain to the source of the third PMOS transistor T3, is placed in series with the ninth PMOS transistor T9, which is connected by its source to the DC voltage Vdd. The tenth PMOS transistor T10, connected by its drain to the source of the third PMOS transistor T3, is placed in series with the eleventh PMOS transistor T11 whose source is linked to a DC voltage Vdd. The order of the connections of the transistors in the various branches may be changed without modifying the final function of the structure, for example, in the branch Br1, T4 and T5 can be swapped.

Finally, the transistor T3 is connected, by its drain to node N1 and by its source to node N3. Its gate receives the clock signal Cp and becomes conductive on a falling edge of this signal Cp.

Likewise, the first transistor T1 is coupled up to the output of the multiplexer block B1, in other words, by its drain to the common node N1, and by its source, to the ground. Its gate receives the clock signal Cp and becomes conductive on a high phase of the signal Cp. Thus, the first and second stages ET1 and ET2 are transparent on a low clock phase CP, and transmit the value of D to the first latching block B2.

This first block B2, whose input is connected to node N1, comprises a first half-inverter IV1, a first logic gate P1 and a second half-controlled loopback inverter IV2. The first inverter IV1 is controlled on a low phase of the clock signal Cp, like the multiplexer block B1. The first inverter IV1 is followed by a first storage stage BS1 formed here of the second inverter IV2 and of a first head to tail NAND gate P1. More precisely, the second inverter IV2 operates on a high phase of the clock signal CP.

The first input "p" of the first NAND gate P1 receives the signal exiting the first inverter IV1. The first input "p" has a fourth node N4 common with the output of the first inverter IV1 and that of the second inverter IV2.

The second input "q" of the first NAND gate P1 receives an asynchronous reset command RN. The output "a" of the first NAND gate P1 and the input of the second inverter IV2 have a fifth common node N5 thus forming the input of the third block B3. The second inverter IV2 and the first NAND gate P1 have a fourth node N4 in common corresponding to the output of the first inverter IV1, and a fifth node in common N5 corresponding to the output of the second block B2.

The second latching block B3 comprises a third half-controlled inverter IV3, a fourth half-controlled inverter IV4, a second storage stage BS2, and a fifth inverter IV5 at output. The second PMOS transistor T2 is connected between the third and fourth inverters IV3 and IV4.

The third inverter IV3 is controlled by the clock signal Cp. Its output corresponds to a sixth common node N6 between the input of the fourth inverter IV4 and the drain of the second PMOS transistor T2. This second PMOS transistor T2 is linked by its source to a DC voltage Vdd, while its gate is controlled by the clock signal Cp. Finally, the fourth inverter is also controlled by the clock signal CP. Its output corresponds to a seventh common node N7 situated between the second storage stage BS2 and the fifth inverter IV5.

The second storage stage BS2 is formed here of a sixth half-controlled loopback inverter IV6 and of a second head to tail NOR gate P2. The sixth inverter IV6 is controlled on a low phase of the clock signal Cp. To the seventh common node N7 is linked a first input "r" of the second NOR gate P2 and the input of the fifth inverter IV5. A second input "s" of the second NOR gate P2 receives an asynchronous reset command RNn. The output "b" of the second gate P2 is coupled to an eighth node N8 in common with the input of the sixth inverter IV6. The fifth inverter IV5, whose input is situated at the level of the seventh node N7, corresponds to the output of the circuit and delivers the final signal Q as output.

Thus, the first block B1 is a multiplexer with two stages ET1 and ET2 receiving, at the input of each stage, the data D or TI following the selection signal for the multiplexer TE and its inverse TEn. The multiplexer is controlled by a single clock signal Cp. The control, by a single clock phase, reduces energy consumption and reduces the delay of the clock signal Cp with respect to the data item, and renders negative, the hold time for a data item.

However, the presence of a single clock signal may be possible under steady conditions if a first transistor T1 is installed at the output of the first block B1. Indeed, when the activity of the clock is too low, or when stationary in the high state, a short-circuit can be created if the data D/TI cut off ET1, and allow the potential of N1 to be established through the leakage currents at an intermediate level inducing a short-circuit current in IV1. Thus, installing a first transistor T1 between the third common node N3 and the ground may fix a potential at each point of the first block B1.

The data D represents the data to be stored in the flip-flop of master-slave type formed by the second and third blocks B2 and B3. Thus after having been selected, via the first block B1, the data D enters the second block B2 upon the falling edge of the clock signal and then enters the third block B3 upon the rising edge of the clock signal. The state is therefore stored in the first feedback loop formed by the first logic gate P1 and the second inverter IV2 on a low phase of the clock signal, and then in the second feedback loop formed by the second gate P2 and the sixth inverter IV6 on a high phase of the clock signal. The assembly copies over the data item at input to the output on a rising edge of the clock carrying out the desired flip-flop function.

It should however be noted that by swapping the active phases of the clock, the types, P or N, of the transistors or the polarity of the power supplies, it may be relatively easy to transform the device presented into a flip-flop transparent on a falling edge. In a similar manner to the transistor T1, when the activity of the clock is too low or when stationary, but has a low level, the second transistor T2 between the voltage Vdd and the output of the third inverter IV3 may avoid a short-circuit due to the presence of a single clock phase in the third block B3.

The multiplexer block B1 and the first inverter IV1 are for the installation of a memory with latching with a clock signal according to Svensson. The same holds for the third and fourth inverters, respectively IV3 and IV4. Finally, to preserve the parity of the logic signals, a fifth inverter IV5 is at the input of the second feedback loop formed by the second gate P2 and the sixth inverter IV6. Such a device may be incorporated, for example, into a circuit with ultra low consumption.

That which is claimed:

1. A flip-flop device comprising:
a multiplexing circuit configured to receive, as input, data to be latched and to be clocked by a clock signal;
a first master stage configured to latch the data and to be clocked based upon a first type phase of the clock signal, said first master stage comprising
a NAND logic gate having an input,
a first inverter coupled to the input of said NAND logic gate, and
a first loopback inverter coupled in parallel with said NAND logic gate; and
a second slave stage configured to latch the data and to be clocked based upon a second type of phase of the clock signal, said second slave stage comprising
a NOR logic gate having an input,
second and third inverters coupled in series at the input of said NOR logic gate, and
a second loopback inverter coupled in parallel with said NOR logic gate.

2. The flip-flop device according to claim 1, wherein said first inverter comprises a metal oxide semiconductor (MOS) inverter.

3. The flip-flop device according to claim 1, wherein said second and third inverters each comprises a metal oxide semiconductor (MOS) inverter.

4. The flip-flop device according to claim 1, wherein said NAND logic gate and said first loopback inverter are configured to have an asynchronous initialization function of one of the SET and RESET types, and being independent of the clock signal.

5. The flip-flop device according to claim 1, wherein said NOR logic gate and said second loopback inverter are configured to have an asynchronous initialization function of one of SET and RESET types, and being independent of the clock signal.

6. The flip-flop device according to claim 1, further comprising an n-channel metal oxide semiconductor (NMOS) transistor between said multiplexing circuit and said first master stage and being dependent on the clock signal.

7. The flip-flop device according to claim 1, further comprising a p-channel metal oxide semiconductor (PMOS) transistor between said second and third inverters and being dependent on the clock signal.

8. A flip-flop device comprising:
a multiplexing circuit configured to receive, as input, data to be latched and to be clocked by a clock signal;
a first master stage configured to latch the data and comprising a first latching memory having an input, and a first inverter coupled at the input of the first latching memory, said first master stage configured to be clocked based upon a first type of phase of the clock signal; and
a second slave stage configured to latch data and comprising a second latching memory having an input, and second and third inverters coupled series at the input of the second latching memory, said second slave stage configured to be clocked based upon a second type of phase of the clock signal.

9. The flip-flop device according to claim 8, wherein said first inverter comprises a metal oxide semiconductor (MOS) inverter.

10. The flip-flop device according to claim 8, wherein said second and third inverters each comprises a metal oxide semiconductor (MOS) inverter.

11. The flip-flop device according to claim 8, wherein said first latching memory comprises a first loopback inverter and a NAND logic gate coupled in parallel.

12. The flip-flop device according to claim 8, wherein said second latching memory comprises a second loopback inverter and a NOR logic gate coupled in parallel.

13. A method of operating a flip-flop device comprising a multiplexing circuit configured to receive, as input, data to be latched, a first master stage configured to latch the data and a second slave stage configured to latch the data, the method comprising:

clocking the multiplexing circuit with a clock signal;
clocking a first inverter coupled to an input of a first latching memory of the first master stage based upon a first type of phase of the clock signal; and
clocking second and third invertors coupled in series to an input of a second latching memory of the second slave stage based upon a second type of phase of the clock signal.

14. The method according to claim 13, wherein the first latching memory comprises a first loopback inverter and a NAND logic gate coupled in parallel.

15. The method according to claim 13, wherein the second latching memory comprises a second half-controlled loopback inverter and a NOR logic gate coupled in parallel.

* * * * *